(12) United States Patent
Lu et al.

(10) Patent No.: US 11,947,050 B2
(45) Date of Patent: Apr. 2, 2024

(54) TEMPERATURE CONTROL THROUGH THERMAL RECYCLE

(71) Applicant: Beijing Voyager Technology Co., Ltd., Beijing (CN)

(72) Inventors: Yue Lu, Mountain View, CA (US); Yu-Ching Yeh, Mountain View, CA (US); Youmin Wang, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 448 days.

(21) Appl. No.: 17/369,822

(22) Filed: Jul. 7, 2021

(65) Prior Publication Data
US 2023/0011457 A1    Jan. 12, 2023

(51) Int. Cl.
| | | |
|---|---|---|
| *G01S 7/497* | (2006.01) | |
| *B60W 60/00* | (2020.01) | |
| *G01S 7/481* | (2006.01) | |
| *G02B 26/10* | (2006.01) | |
| *H01S 5/024* | (2006.01) | |
| *H05B 1/02* | (2006.01) | |

(52) U.S. Cl.
CPC ........... *G01S 7/497* (2013.01); *B60W 60/001* (2020.02); *G01S 7/4811* (2013.01); *G01S 7/4817* (2013.01); *G02B 26/101* (2013.01); *H01S 5/02415* (2013.01); *H05B 1/0236* (2013.01); *B60W 2420/52* (2013.01)

(58) Field of Classification Search
CPC ...... G01S 7/497; G01S 7/4811; G01S 7/4817; G01S 7/481; G01S 17/931; B60W 60/001; B60W 2420/52; G02B 26/101; G02B 7/1815; H01S 5/02415; H05B 1/0236
See application file for complete search history.

(56) References Cited

U.S. PATENT DOCUMENTS

| | | | | | |
|---|---|---|---|---|---|
| 4,387,297 | A | * | 6/1983 | Swartz | G06K 7/10881 250/568 |
| 5,625,183 | A | * | 4/1997 | Kashitani | H04N 1/0473 250/236 |
| 5,848,305 | A | * | 12/1998 | Takasaki | G02B 7/32 377/57 |

(Continued)

*Primary Examiner* — Mussa A Shaawat
(74) *Attorney, Agent, or Firm* — Kilpatrick Townsend & Stockton LLP

(57) ABSTRACT

An excess heat-generating element is coupled to a heat sink through a heat conduction path. A thermal switch is mounted in the heat conduction path. A temperature-sensitive element is coupled to the heat conduction path on a same side of the thermal switch as the excess heat-generating element. A temperature monitor is mounted adjacent the temperature-sensitive element. A temperature controller has an input coupled to the temperature output of the temperature monitor and an output control line coupled to an input of the thermal switch. The temperature controller switches off the thermal switch, in response to detecting a temperature below a temperature threshold from the temperature output. When the thermal switch it off, it impedes heat flow from the excess heat-generating element to the heat sink, and the heat flow is redirected to increase heat flow from the excess heat-generating element to the heat-sensitive element.

20 Claims, 9 Drawing Sheets

(56) References Cited

U.S. PATENT DOCUMENTS

| | | | | |
|---|---|---|---|---|
| 7,301,608 B1* | 11/2007 | Mendenhall | G01S 17/18 | 356/4.1 |
| 7,379,100 B2* | 5/2008 | Gokturk | G01S 17/89 | 348/229.1 |
| 8,767,190 B2* | 7/2014 | Hall | G01S 17/89 | 356/9 |
| 8,902,408 B2* | 12/2014 | Bridges | G01S 7/497 | 367/27 |
| 8,965,691 B1* | 2/2015 | Lombrozo | G01P 13/04 | 701/41 |
| 9,063,549 B1* | 6/2015 | Pennecot | G01S 17/93 | |
| 9,151,831 B2* | 10/2015 | Mase | G01S 7/4861 | |
| 9,164,173 B2* | 10/2015 | Bridges | G01C 15/002 | |
| 10,012,732 B2* | 7/2018 | Eichenholz | G01S 7/484 | |
| 10,048,358 B2* | 8/2018 | Berger | G01S 7/497 | |
| 10,340,651 B1* | 7/2019 | Drummer | H01S 3/094003 | |
| 10,571,552 B1* | 2/2020 | Gao | G02B 26/0816 | |
| 10,852,431 B1* | 12/2020 | Duan | G01S 7/484 | |
| 11,467,595 B2* | 10/2022 | Templeton | G01S 7/484 | |
| 2002/0114053 A1* | 8/2002 | Yasuda | B81B 3/0067 | 359/224.1 |
| 2003/0143958 A1 | 7/2003 | Elias et al. | | |
| 2004/0070745 A1* | 4/2004 | Lewis | G01S 7/4868 | 356/5.01 |
| 2004/0135644 A1* | 7/2004 | Mizoguchi | G02B 26/0841 | 331/154 |
| 2005/0099776 A1 | 5/2005 | Xue et al. | | |
| 2005/0213074 A1* | 9/2005 | Hoashi | G01S 7/497 | 356/450 |
| 2005/0275710 A1* | 12/2005 | Dewa | B41J 2/473 | 347/237 |
| 2006/0066282 A1* | 3/2006 | Soeda | H02K 11/215 | 318/685 |
| 2007/0257766 A1 | 11/2007 | Richards et al. | | |
| 2007/0291343 A1* | 12/2007 | Kato | B81B 3/0067 | 359/199.1 |
| 2009/0008532 A1* | 1/2009 | Setoguchi | H04N 25/77 | 348/E3.018 |
| 2009/0009850 A1* | 1/2009 | Shirai | G02B 26/0841 | 359/290 |
| 2009/0123158 A1* | 5/2009 | Ray | G01S 7/4812 | 398/140 |
| 2009/0284731 A1* | 11/2009 | Jin | G01B 11/22 | 356/4.01 |
| 2010/0073541 A1* | 3/2010 | Kawahito | H01L 27/14623 | 348/311 |
| 2011/0037969 A1* | 2/2011 | Spickermann | G01S 7/4863 | 356/5.01 |
| 2012/0182540 A1* | 7/2012 | Suzuki | H01L 27/14609 | 356/4.01 |
| 2012/0194799 A1* | 8/2012 | Kamiyama | H01L 27/14607 | 257/E31.124 |
| 2012/0247707 A1 | 10/2012 | Surdeanu et al. | | |
| 2013/0063799 A1* | 3/2013 | Honda | H02K 33/16 | 359/200.7 |
| 2014/0151535 A1* | 6/2014 | Mori | G02B 26/101 | 359/200.7 |
| 2015/0192676 A1* | 7/2015 | Kotelnikov | G01S 17/42 | 356/5.03 |
| 2015/0202939 A1* | 7/2015 | Stettner | B60R 21/36 | 701/45 |
| 2015/0333480 A1* | 11/2015 | Santis | H01S 5/2231 | 372/45.01 |
| 2016/0047903 A1* | 2/2016 | Dussan | G01S 17/42 | 356/5.01 |
| 2016/0233753 A1 | 8/2016 | Benner, Jr. | H02K 21/21 | |
| 2017/0285148 A1* | 10/2017 | Hipp | G01S 7/4815 | |
| 2018/0156971 A1* | 6/2018 | Droz | G02B 27/0994 | |
| 2018/0164413 A1* | 6/2018 | Gnecchi | G01S 17/10 | |
| 2020/0319303 A1* | 10/2020 | Cionca | G01S 7/481 | |
| 2021/0003671 A1* | 1/2021 | Diehl | B60R 13/08 | |
| 2022/0260695 A1* | 8/2022 | Barber | G01S 7/4911 | |
| 2023/0243977 A1* | 8/2023 | Buoniconti, IV | G01S 7/4817 | 356/4.01 |
| 2023/0333255 A1* | 10/2023 | Angus | G01S 7/4817 | |

* cited by examiner

TEMPERATURE CONTROL THROUGH THERMAL RECYCLE

BACKGROUND OF THE INVENTION

Unless otherwise indicated herein, the materials described in this section are not prior art to the claims in this application and are not admitted to be prior art by inclusion in this section. In particular, disparate technologies are discussed that it would not be obvious to discuss together absent the teachings of the present invention.

Modern vehicles are often equipped with sensors designed to detect objects and landscape features around the vehicle in real-time to enable technologies such as lane change assistance, collision avoidance, and autonomous driving. Some commonly used sensors include image sensors (e.g., infrared or visible light cameras), acoustic sensors (e.g., ultrasonic parking sensors), radio detection and ranging (RADAR) sensors, magnetometers (e.g., passive sensing of large ferrous objects, such as trucks, cars, or rail cars), and light detection and ranging (LiDAR) sensors.

A LiDAR system typically uses a light source and a light detection system to estimate distances to environmental features (e.g., pedestrians, vehicles, structures, plants, etc.). For example, a LiDAR system may transmit a light beam (e.g., a pulsed laser beam) to illuminate a target and then measure the time it takes for the transmitted light beam to arrive at the target and then return to a receiver near the transmitter or at a known location. In some LiDAR systems, the light beam emitted by the light source may be steered across a two-dimensional or three-dimensional region of interest according to a scanning pattern, to generate a "point cloud" that includes a collection of data points corresponding to target points in the region of interest. The data points in the point cloud may be dynamically and continuously updated, and may be used to estimate, for example, a distance, dimension, location, and speed of an object relative to the LiDAR system.

In a LiDAR system, laser diodes are used as the light source. The light is emitted from the transmitter, reflected by the object, and then captured by the receiver. The time-of-flight is measured to estimate the object distance. Since laser wavelength highly depends on the operating temperature, a wide-band optical filter is typically used before the receiver to support a large operating temperature range. However, the wide-band optical filter also allows a large amount of background light to come in, and thus increases the background noise. Thus, it is desirable to increase the signal-to-noise ratio (SNR) by limiting the temperature range, and allow a narrow band filter, by heating or cooling the laser as needed to limit the wavelength variation.

Light steering typically involves the projection of light in a pre-determined direction to facilitate, for example, the detection and ranging of an object, the illumination and scanning of an object, or the like. Light steering can be used in many different fields of applications including, for example, autonomous vehicles, medical diagnostic devices, etc., and can be configured to perform both transmission and reception of light. For example, a light steering transmitter may include a micro-mirror to control the projection direction of light to detect/image an object. Moreover, a light steering receiver may also include a micro-mirror to select a direction of incident light to be detected by the receiver, to avoid detecting other unwanted signals.

Micro-mirror devices can be designed to operate (scan) at a resonant frequency of the MEMS mirror structure for larger scanning angles. The resonant frequency can be controlled by the design of the MEMS mirror structure and the supporting torsion springs that support them. By operating at the resonant frequency, the mirror can more easily be rotated, with less power, since it tends to resonate or oscillate at that frequency. This allows the achievement of a large scanning angle with a low operating voltage. When the surrounding temperature changes, stress develops at the interface between the device and its package, a die attach layer and a PCB because of a mismatch in CTE (coefficient of thermal expansion) of the various materials. The tension changes within the torsion springs coupled to the suspended micro-mirror. This results in a shift of the micro-mirror's resonant frequency, and related system components need to adapt to the new frequency. In addition to the frequency change, the tension between the micro-mirror and the package may also result in a bowed micro-mirror (ideally the micro-mirror or mirror array should be perfectly flat sitting on a silicon die substrate) and thus cause un-wanted light divergence. Accommodating for such temperature sensitivity can greatly increase the complexity of overall system. Thus, it is desirable to control the temperature of the micro-mirror assembly to limit variations in resonant frequency due to changes in temperature.

BRIEF SUMMARY OF THE INVENTION

Techniques disclosed herein relate generally to temperature control of lasers, micro-mirrors and other structures that can be used in, for example, light detection and ranging (LiDAR) systems or other light beam steering systems. More specifically, and without limitation, disclosed herein is an apparatus and method for transferring undesired heat from a heat-generating electronic element to a temperature-sensitive element.

In one embodiment, an excess heat-generating element is coupled to a heat sink through a heat conduction path. A thermal switch is mounted in the heat conduction path. A temperature-sensitive element is coupled to the heat conduction path on a same side of the thermal switch as the excess heat-generating element. A temperature measurement device is mounted adjacent the temperature-sensitive element. A temperature controller has an input coupled to the temperature output of the temperature measurement device and an output control line coupled to an input of the thermal switch. The temperature controller switches off the thermal switch, in response to detecting a temperature below a temperature threshold from the temperature output of the temperature measurement device. When the thermal switch it off, it impedes heat flow from the excess heat-generating element to the heat sink, and the heat flow is redirected to increase heat flow from the excess heat-generating element to the heat-sensitive element.

According to certain embodiments, the excess heat-generating element is a power module, Field Programmable Gate Array (FPGA), controller, or other heat-generating electronic device. The temperature-sensitive element is a laser, mirror assembly or other device whose performance is affected by temperature. The thermal switch is a thermo-electric cooler or controller (TEC) or a MEMS thermal switch or other thermal switch. The thermal path is a metal trace or a semiconductor such as silicon carbide, or other material with low heat resistance.

According to certain embodiments, a laser or mirror assembly is heated to a minimum of 15-20° C. Once the laser or mirror assembly reaches a desired threshold temperature (at the minimum temperature or higher) the thermal switch is switched on to avoid heating the laser or mirror assembly beyond a desired upper limit.

In another embodiment, an apparatus for beam steering in a Light Detection and Ranging (LiDAR) system of an autonomous vehicle is provided. The apparatus includes a printed circuit board and a laser and/or a mirror assembly mounted on the printed circuit board. A temperature monitor (e.g., a thermistor) is mounted adjacent the laser and/or mirror assembly. A LiDAR chip which produces excess heat (e.g., FPGA controller or power module) is mounted on the printed circuit board. A heat conduction path (e.g., metal trace) couples the LiDAR chip to the laser and/or mirror assembly. A thermal switch couples the heat conduction path to a heat sink. A temperature controller has an input coupled to a temperature output of the temperature monitor and has an output control line coupled to an input of the thermal switch. The temperature controller is configured to switch off the thermal switch in response to detecting a temperature below a temperature threshold from the temperature output of the temperature monitor, in order to impede heat flow from the LiDAR chip to the heat sink, and increase heat flow from the LiDAR chip to the laser and/or mirror assembly.

In one embodiment, a method is provided for heating a temperature-sensitive element. Excess heat is generated with an excess heat-generating element. The excess heat is directed to a heatsink through a thermal switch. The excess heat-generating element is coupled to the temperature-sensitive element with a thermal path. The temperature adjacent the temperature-sensitive element is measured with a temperature-measuring element to provide a measured temperature. The measured temperature is monitored with a temperature controller. In response to the measured temperature being below a threshold, the temperature controller controls the thermal switch to redirect the excess heat along a thermal path to the temperature-sensitive element.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to the appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention, will be more apparent from the following detailed description taken in conjunction with the accompanying drawings, in which.

DETAILED DESCRIPTION OF THE INVENTION

Figure 1:
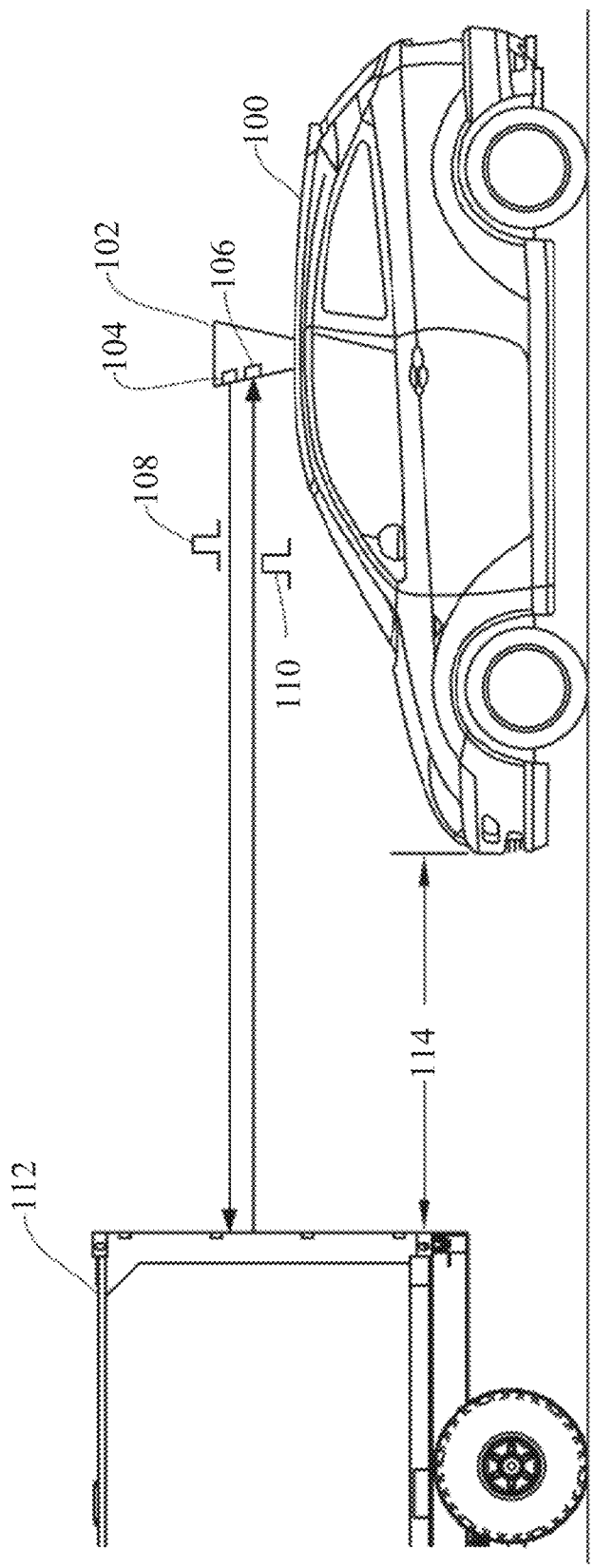
FIG. 1 shows an autonomous vehicle with a LiDAR system, according to certain embodiments.

Aspects of the present disclosure relate generally to a LiDAR system, and more particularly to controlling the temperature of an element to improve performance.

In the following description, various examples of temperature control structures are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

According to embodiments, this invention describes a method and apparatus for heating a temperature-sensitive element with excess heat from another element. This reduces adverse effects on the operation of the temperature sensitive element due to temperature changes. For example, the temperature sensitive element can be a laser diode in a LiDAR system. Limiting the changes in temperature limits changes in the laser bandwidth, allowing a narrow-band filter to be used to block out ambient noise. Where the temperature sensitive element is a MEMS mirror array, limiting temperature variations avoids changes to the resonant frequency, reducing the power requirements. Embodiments use excess heat from another chip, reducing or eliminating the need to provide separate heating elements which can add to cost and complexity, as well as requiring more power to operate.

In one embodiment, an apparatus has an excess heat-generating element 302 connected to a temperature-sensitive element 306 through a heat conduction path 304. A thermal switch 308 connects heat conduction path 304 to a heat sink 310. A temperature measurement device 704 is mounted adjacent the temperature-sensitive element and a temperature controller 716 switches off the thermal switch in response to detecting a temperature below a temperature threshold. This impedes heat flow from the excess heat-generating element to the heat sink, and increases heat flow from the excess heat-generating element to the temperature-sensitive element.

Advantages and Uses.

For LiDAR systems, an infrared (IR) laser is typically used so that the light is not visible and is not an annoyance or danger to the eyes. In particular, near IR band lasers are desirable. However, near IR band diode lasers generally have a large wavelength temperature dependence, e.g. a 0.3 nm/dC temp. coefficient. For a wide-temperature requirement such as the automotive LiDAR, this translates into a large laser wavelength shift with temperature. For example, a −40 to +85 degrees Celsius temperature range would result in ~38 nm wavelength shift. That means at least a 38 nm optical filter window is needed on the receiver side to collect all the reflected laser power. Such a large filter window will inevitably introduce large solar/ambient infrared noise and thus reduce the overall Signal-to-Noise Ratio (SNR).

One solution is to use a temperature control system to stabilize the laser's working temperature and thus reduce the wavelength shift. This is done by setting a specific target temperature or a small temperature range. For example, a system can target to stabilize a working temperature to a range of +40 to +50 degree C., in an environment where the ambient temperature changes from −40 to +85. This can be done with devices such as a Thermoelectric Cooler (TEC). However, a powerful, expensive, and high energy-consuming TEC is required for such a large ambient temperature range. TECs come in multiple stages, which can be like a multi-story heatsink, also requiring a lot of room. Also, a TEC is less efficient in cooling than heating, so bringing down the temperature will generate a lot of heat that needs to be dissipated through a heatsink, requiring a large heatsink or even a fan. This additional heat may actually result in system instability (e.g. thermal runaway), in addition to inability to serve its original purpose of temperature control. Thus, it is difficult to achieve a practical solution for a LiDAR system.

More specifically, and without limitation, disclosed herein are embodiments, where, instead of just controlling the temperature to a narrow range with both heating and cooling, a laser diode 702 is heated to a minimum target temperature to essentially narrow the ambient temperature range of operation. Thus, although the system is designed for an actual environment temperature range of −40 to +85° C., the ambient temperature that the laser diode sees is only, e.g., +20 to 85° C. This is accomplished by activating the transfer of heat from an excess heat generating element when an environment temperature of less than 20° C. is detected. The heating is deactivated when the temperature sensor reports an environment temperature greater than the minimum target temperature, e.g., 20° C.

An advantage of heating where there is TEC control to provide a narrower temperature range is that the TEC then needs to control less, allowing a simpler TEC to be used, such as a single stage TEC. This means the TEC is less expensive, less bulky, uses less power and throws off less heat. An even simpler embodiment is using heating resistors instead of a TEC, as discussed in more detail below.

An additional issue in LiDAR systems is aligning the laser beam of the laser diode with the other optics in the system. Temperature changes can cause misalignment. Because of the differences in the Coefficient of Thermal Expansion (CTE) in the different semiconductor layers of the laser diode, the heatsink, the PCB, etc., the laser beam can tilt with temperature changes, causing alignment issues. By heating to a minimum target temperature, this tilt is both minimized and more predictable. The laser diode and accompanying optics can be aligned while heated to the minimum target temperature, rather than whatever the ambient temperature is during assembly. Accordingly, the heating control allows alignment issues to be minimized.

Generally, aspects of the invention are directed to implementations of light steering, which can be used in a number of different applications. For example, a Light Detection and Ranging (LiDAR) module of an autonomous vehicle may incorporate a light steering system. The light steering system can include a transmitter and receiver system to steer emitted incident light in different directions around a vehicle, and to receive reflected light off of objects around the vehicle using a sequential scanning process, which can be used to determine distances between the objects and the vehicle to facilitate autonomous navigation.

Light steering can be implemented by way of micromirror assemblies as part of an array, with each micro-mirror assembly having a movable micro-mirror and an actuator (or multiple actuators). The micro-mirrors and actuators can be formed as microelectromechanical systems (MEMS) on a semiconductor substrate, which allows for the integration of the MEMS with other circuitries (e.g., controller, interface circuits, etc.) on the semiconductor substrate, which can allow for simpler, easier, more robust, and cost-effective manufacturing processes.

In a micro-mirror assembly, a micro-mirror can be mechanically connected (e.g., "anchored") to the semiconductor substrate via a connection structure (e.g., torsion bar, torsion spring, torsion beam, etc.) to form a pivot point and an axis of rotation. As described herein, "mechanically connected," or "connected," can include a direct connection or an indirect connection. For example, the micro-mirror can be indirectly connected to the substrate via a connection structure (e.g., torsion bar or torsion spring) to form a pivot/connection point. The micro-mirror can be rotated around the pivot/connection point ("referred to herein as a pivot point") on the axis of rotation by an actuator. An electrostatic actuator is typically used; however, any suitable type of actuator may be implemented (e.g., piezoelectric, thermal mechanical, etc.), and one of ordinary skill in the art with the benefit of this disclosure would appreciate the many modifications, combinations, variations, and alternative embodiments thereof.

In some embodiments, each micro-mirror can be configured to be rotated by a rotation angle or moved vertically to reflect (and steer) light towards a target direction. For rotation, the connection structure can be deformed to accommodate the rotation, but the connection structure also has a degree of spring stiffness, which varies with the rotation angle and counters the rotation of the micro-mirror to set a target rotation angle. To rotate a micro-mirror by a target rotation angle, an actuator can apply a torque to the micro-mirror based on the rotational moment of inertia of the mirror, as well as the degree of spring stiffness for a given target rotation angle. Different torques can be applied to rotate (e.g., oscillate) the micro-mirror at or near a resonant frequency to achieve different target rotation angles. The actuator can then remove the torque, and the connection structure can return the micro-mirror back to its default orientation for the next rotation. A vertical actuator, such as an electrostatic force actuator, or a thermal actuator with a piston, can be used in embodiments. The rotation or vertical displacement of the micro-mirror can be repeated in the form of an oscillation, typically at or near a resonant frequency of the micro-mirror based on the mass of the micro-mirror and the spring constant of the connection structure.

Micro-mirror devices used in a LIDAR system can be designed to operate (scan) at a resonant frequency of the MEMS mirror structure for larger scanning angles. By operating at the resonant frequency, the mirror can more easily be rotated, with less power, since it tends to resonate or oscillate at that frequency. Stress develops in the interface between the MEMS mirror structure chip (die) and the package because of a mismatch in CTE (coefficient of thermal expansion) of the two materials. For example, a die could be mainly made of silicon and an enclosure could be a ceramic package which is made of alumina. The CTE of these two materials are different and they expand and contract at different rates with temperature. Alumina expands and contracts more than silicon, and thus stress develops at the interface of the two materials. This stress is transmitted to the devices in the substrate and can especially be noticeable in MEMS devices. In particular, such stresses can change the resonant frequency of a MEMS micro mirror with changes in temperature. Also, there may be inherent process variation during fabrication of microstructures. Achieving a target resonant frequency becomes especially important when multiple microstructures need to be operated together at the resonant frequency, such as an array of micro-mirrors. In order to achieve a large aperture, large die sizes are typically required. But due to the large die sizes, process uniformity within a single die becomes critical when all micro-mirrors are needed to be operated in sync. Any process non-uniformity across a wafer become more pronounced when die size increases. That would lead to variation in resonant frequency of individual micro-mirrors and operating them in synchronization would become more challenging. Controlling the temperature allows the minimization of these effects on the resonant frequency of the MEMS mirror structure.

Typical System Environment for Certain Embodiments of the Invention

FIG. 1 illustrates an autonomous vehicle 100 in which the various embodiments described herein can be implemented. Autonomous vehicle 100 can include a LiDAR module 102. LiDAR module 102 allows autonomous vehicle 100 to perform object detection and ranging in a surrounding environment. Based on the result of object detection and ranging, autonomous vehicle 100 can drive according to the rules of the road and maneuver to avoid a collision with detected objects. LiDAR module 102 can include a light steering transmitter 104 and a receiver 106. Light steering transmitter 104 can project one or more light signals 108 at various directions (e.g., incident angles) at different times in any suitable scanning pattern, while receiver 106 can monitor for a light signal 110 which is generated by the reflection of light signal 108 by an object. Light signals 108 and 110 may include, for example, a light pulse, a frequency modulated continuous wave (FMCW) signal, an amplitude modulated continuous wave (AMCW) signal, etc. LiDAR module 102 can detect the object based on the reception of light signal 110, and can perform a ranging determination (e.g., a distance of the object) based on a time difference between light signals 108 and 110, as would be appreciated by one of ordinary skill in the art with the benefit of this disclosure. For example, as shown in FIG. 1, LiDAR module 102 can transmit light signal 108 at a direction directly in front of autonomous vehicle 100 at time T1 and receive light signal 110 reflected by an object 112 (e.g., another vehicle) at time T2. Based on the reception of light signal 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. Autonomous vehicle 100 can thereby adjust its speed (e.g., slowing or stopping) to avoid collision with object 112 based on the detection and ranging of object 112 by LiDAR module 102.

Figure 2A:
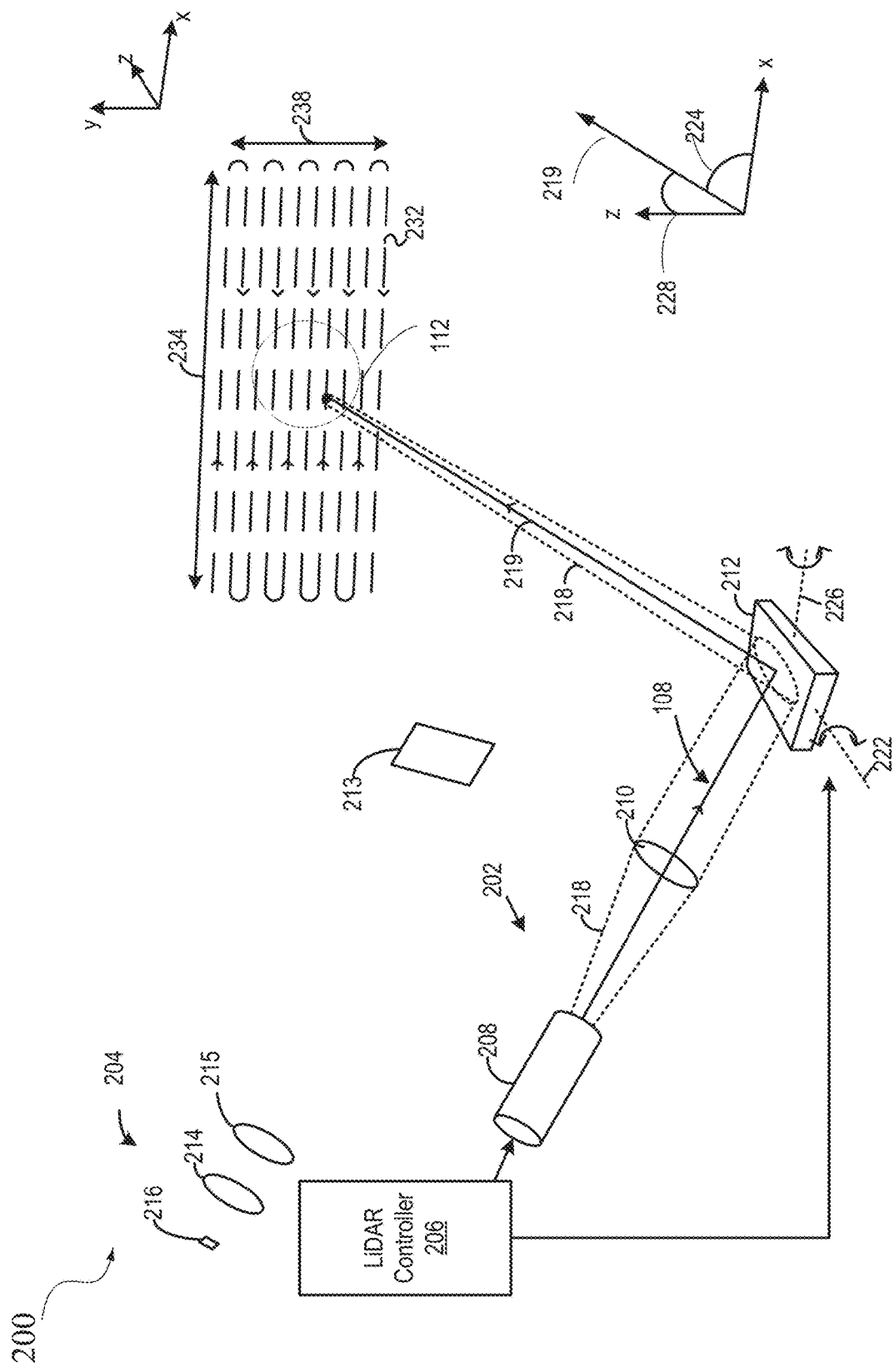
FIG. 2A shows an example of a light projection operation, according to certain embodiments.
Figure 2B:
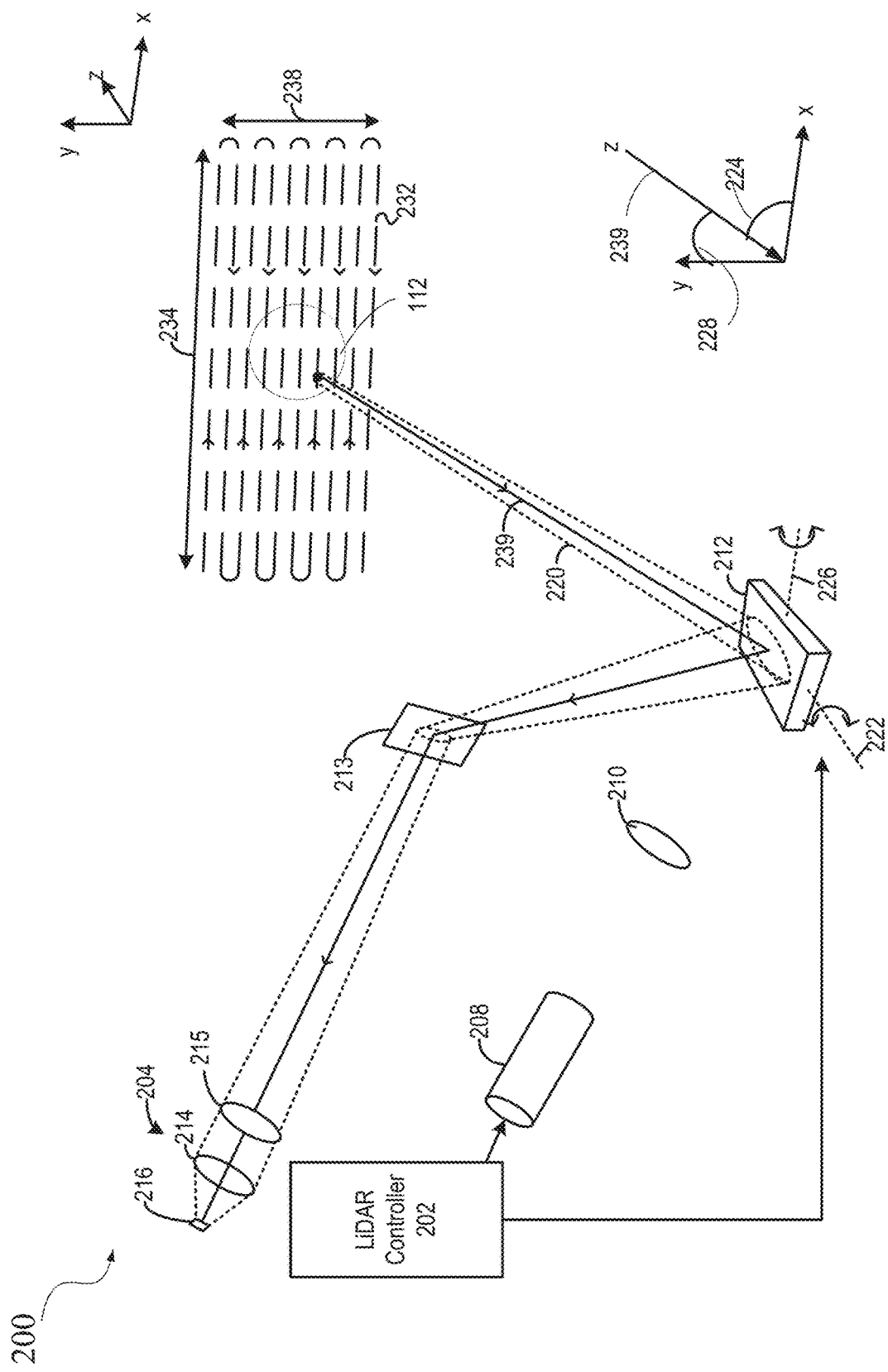
FIG. 2B shows an example of a light detection operation, according to certain embodiments.

FIG. 2A and FIG. 2B illustrate simplified block diagrams of an example of a LiDAR module 200 according to certain embodiments. LiDAR module 200 may be an example of LiDAR system 102, and may include a transmitter 202, a receiver 204, and LiDAR controller 206, which may be configured to control the operations of transmitter 202 and receiver 204. Transmitter 202 may include a light source 208 and a collimator lens 210, and receiver 204 can include a lens 214, an optional filter 215 and a photodetector 216. LiDAR module 200 may further include a mirror assembly 212 (also referred to as a "mirror structure") and a beam splitter 213. In some embodiments, LiDAR module 102, transmitter 202 and receiver 204 can be configured as a coaxial system to share mirror assembly 212 to perform light steering operations, with beam splitter 213 configured to reflect incident light reflected by mirror assembly 212 to receiver 204.

FIG. 2A shows an example of a light projection operation, according to certain embodiments. To project light, LiDAR controller 206 can control light source 208 (e.g., a pulsed laser diode, a source of FMCW signal, AMCW signal, etc.) to transmit light signal 108 as part of light beam 218. Light beam 218 can disperse upon leaving light source 208 and can be converted into collimated light beam 218 by collimator lens 210. Collimated light beam 218 can be incident upon a mirror assembly 212, which can reflect collimated light beam 218 to steer it along an output projection path 219 towards object 112. Mirror assembly 212 can include one or more rotatable mirrors. FIG. 2A illustrates mirror assembly 212 as having one mirror; however, a micro-mirror array may include multiple micro-mirror assemblies that can collectively provide the steering capability described herein. Mirror assembly 212 can further include one or more actuators (not shown in FIG. 2A) to rotate the rotatable mirrors. The actuators can rotate the rotatable mirrors around a first axis 222, and can rotate the rotatable mirrors along a second axis 226. The rotation around first axis 222 can change a first angle 224 of output projection path 219 with respect to a first dimension (e.g., the x-axis), whereas the rotation around second axis 226 can change a second angle 228 of output projection path 219 with respect to a second dimension (e.g., the z-axis). LiDAR controller 206 can control the actuators to produce different combinations of angles of rotation around first axis 222 and second axis 226 such that the movement of output projection path 219 can follow a scanning pattern 232. A range 234 of movement of output projection path 219 along the x-axis, as well as a range 238 of movement of output projection path 219 along the z-axis, can define a FOV. An object within the FOV, such as object 112, can receive and reflect collimated light beam 218 to form a reflected light signal, which can be received by receiver 204 and detected by the LiDAR module, as further described below with respect to FIG. 2B. In certain embodiments, mirror assembly 212 can include one or more comb spines with comb electrodes (see, e.g., FIG. 3), as will be described in further detail below.

FIG. 2B shows an example of a light detection operation, according to certain embodiments. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam splitter 213, which can then divert light beam 220 to photodetector 216 via collimator lens 214 and an optional filter 215. With such arrangements, receiver 204 can selectively receive signals that are relevant for the ranging/imaging of object 112 (or any other object within the FOV), such as light signal 110 generated by the reflection of collimated light beam 218 by object 112, and not to receive other signals. As a result, the effect of environmental disturbance on the ranging and imaging of the object can be reduced, and the system performance may be improved.

Filter 215 can restrict the wavelengths of light that reach photodetector 216 to a narrow range around the laser wavelength, improving the signal to noise ratio of the received signal. Thus, ambient light interference is filtered out. As discussed above in the Background, this requires that the laser diode wavelength not vary beyond that range due to temperature changes. This can be accomplished by controlling the temperature of the laser diode, as discussed below.

Additionally, changes in temperature can affect mirror assembly 212, as discussed in the Background above. In particular, the resonant frequency may change with due to mis-matches in the CTEs of different materials in the mirror assembly, causing stresses which affect the resonant frequency. Maintaining the resonant frequency at the desired scanning frequency is important, since it minimizes the power required to move the mirror assembly, reducing the power requirements of the system.

The laser diode and mirror assembly are just two examples of temperature-sensitive elements that would benefit from thermal recycling according to embodiments of the invention. Any other temperature-sensitive element could be controlled in a similar manner. An example of another temperature-sensitive element is a photodetector (e.g. PIN detector, avalanche photodetector, SPAD or SiPM/MPCC) whose gain and noise floor also depends on temperature.

Temperature Control Through Thermal Recycle

Figure 3:
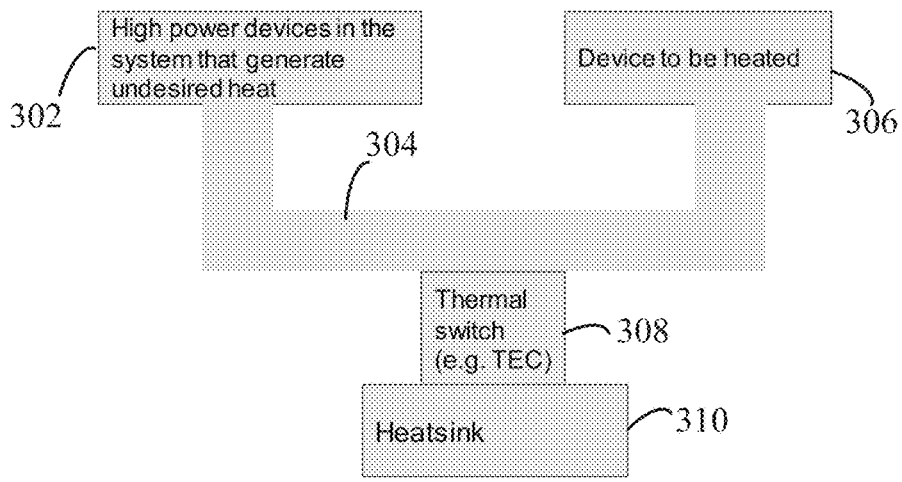
FIG. 3 is a block diagram of a thermal recycling apparatus according to an embodiment.

FIG. 3 is a block diagram of a thermal recycling apparatus according to an embodiment. An excess heat-generating element 302 (e.g., power module or computing module such as CPU, GPU or FPGA, or other high power consumption ICs such as high-speed ADC/amplifiers) is connected through a heat path 304 to a temperature-sensitive element 306 (e.g., laser diode or MEMS mirror assembly). The excess heat-generating element 302 is one or more high power devices in a system that generate undesired heat. Temperature-sensitive element 306 is an element whose temperature needs to be controlled for optimum operation, such as a laser or a micro-mirror assembly. A thermal switch (e.g., TEC) 308 connects heat path 304 to a heat sink 310. In a normal system, heat path 304 would directly couple excess heat-generating element 302 to heat sink 310. Embodiments of this invention extend the heat path 304 to temperature-sensitive element 306, and add the thermal switch 308.

Figure 4:
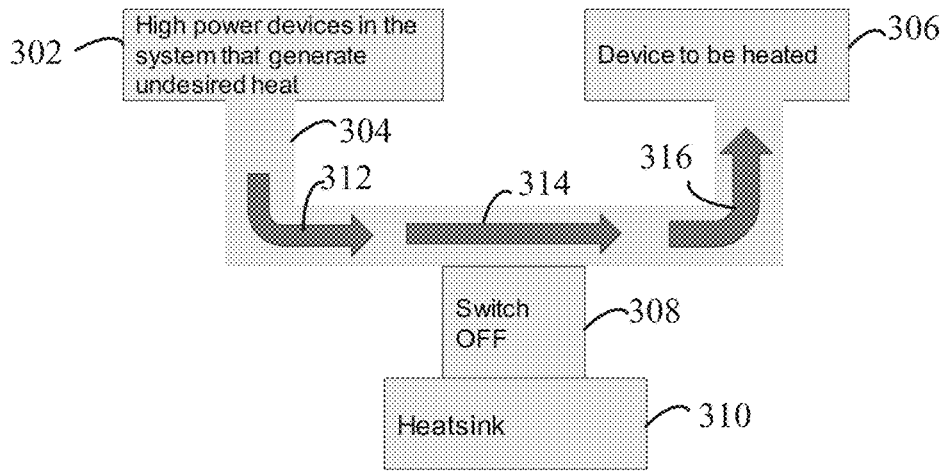
FIG. 4 is a diagram of the thermal recycling apparatus of FIG. 3 with the thermal switch OFF, according to an embodiment.

FIG. 4 is a diagram of the thermal recycling apparatus of FIG. 3 with the thermal switch OFF, according to an embodiment. In this configuration, the flow of heat to heat sink 310 is at least partially blocked. Thus, most of the heat propagates along the path illustrated by arrows 312, 314 and 316 to temperature sensitive element 306.

Figure 5:
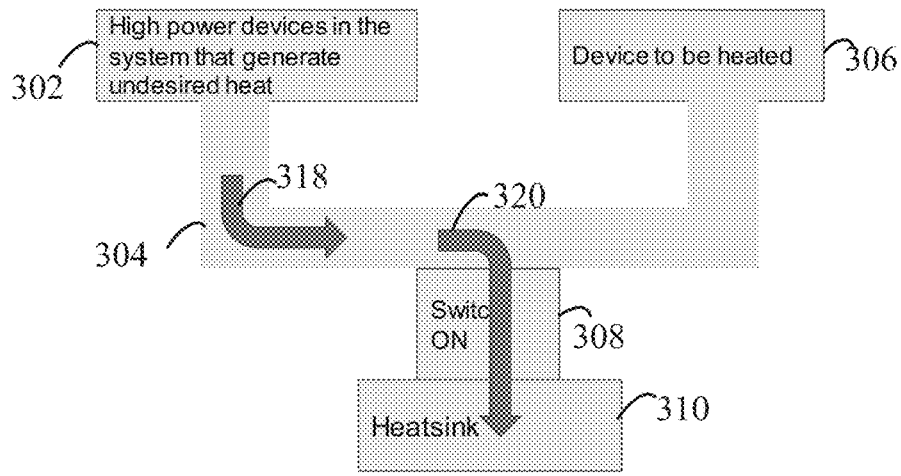
FIG. 5 is a diagram of the thermal recycling apparatus of FIG. 3 with the thermal switch ON, according to an embodiment.

FIG. 5 is a diagram of the thermal recycling apparatus of FIG. 3 with the thermal switch ON, according to an embodiment. In this configuration, the flow of heat to heat sink 310 is enabled. Thus, most of the heat propagates along the path illustrated by arrows 318 and 320 to heat sink 310. To the extent that heat sensitive element 306 has become hotter, its excess heat can also be channeled through heat path 304 and thermal switch 308 to heat sink 310.

According to certain embodiments, the excess heat-generating element is a power module, Field Programmable Gate Array (FPGA), controller, or other heat-generating electronic device. For a LiDAR system, the FPGA controller and/or power module is used as the excess heat-generating device. The temperature-sensitive element is a laser diode or a MEMS mirror assembly or both. The thermal switch is a thermoelectric cooler or controller (TEC), or a MEMS thermal switch, or another thermal switch. In one embodiment, the thermal switch is a single stage TEC. The thermal path is a metal trace or a semiconductor such as silicon carbide, or another low thermal resistance material.

In one embodiment, the thermal switch is a thermoelectric cooler (TEC). Thermoelectric coolers operate by the Peltier effect. The device has two sides, and when a DC electric current flows through the device, it brings heat from one side to the other, so that one side gets cooler while the other gets hotter. Although designed to cool an element, it does this by establishing a heat flow path through the TEC, and thus acts as a thermal switch. By applying the correct current direction to stop heat transfer from the heat-generating side (i.e. hot side) to the heat-sink side (i.e. cool side), it causes it to act as a closed thermal switch.

In an alternate embodiment, the thermal switch includes at least one drop of a thermally conductive liquid (such as a liquid metal or liquid-metal alloy) and is operated to alternately establish a path of high thermal conductance and low thermal conductance between a micro-transducer and a heat source or heat sink via the drop. A first thermally conductive member supports the liquid drop and a second thermally conductive member is a deflectable actuator, such as an electrostatic or piezoelectric transducer. In its non-deflected position, the actuator is spaced from the drop. To activate the thermal switch, the actuator is caused to deflect inwardly and contact the drop, thereby establishing a path of high thermal conductance between the actuator and the base. To de-activate the switch, the actuator is allowed to return to its non-deflected position. An array of thermally conductive drops and deflectable actuators may be used to provide a wider area for heat transfer.

In another embodiment, the thermal switch includes at least one nanostructure (e.g., a bundle of carbon nanotubes), and is operable to alternately establish a path of high thermal conductance and low thermal conductance between a micro-transducer and a heat source or heat sink via the nanostructure. Other examples of thermal switches are set forth in US Pub. No. 20070257766, the disclosure of which is incorporated herein by reference.

In another embodiment, the thermal switch operates in an analog rather than digital manner. Rather than having simply ON and OFF positions, intermediate positions are possible to allow the amount of heating of the temperature-sensitive device to be fine-tuned. In such an embodiment, the excess heat is transferred both along the path of arrows 312-316 and arrows 318-320 of FIGS. 4-5. Thus, if temperature-sensitive element 306 is heated too much, the amount of heat supplied to it can be simply reduced, rather than completely cut off.

Figure 6:
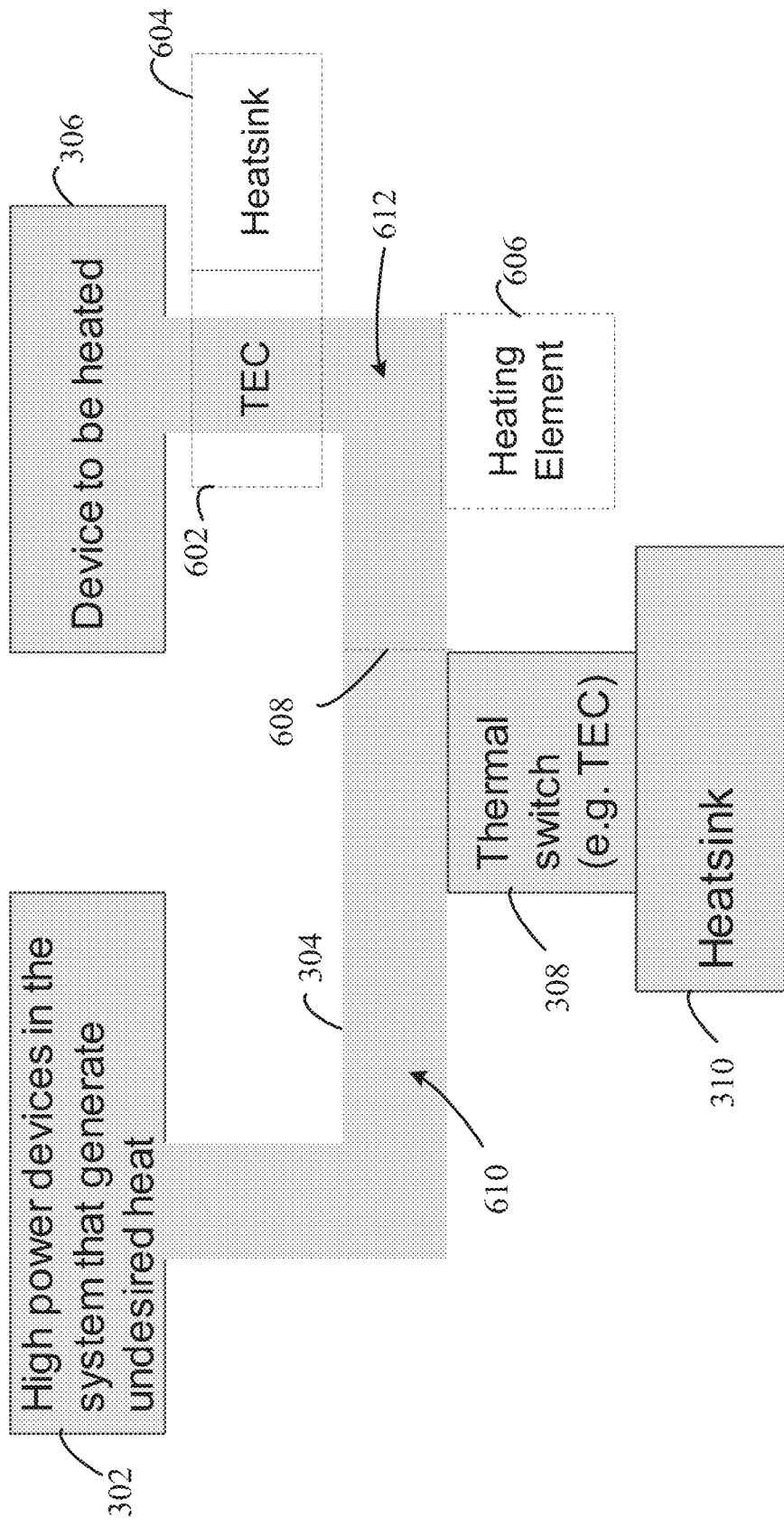
FIG. 6 is a diagram of the thermal recycling apparatus of FIG. 3 with additional optional active temperature control elements, according to an embodiment.

FIG. 6 is a diagram of the thermal recycling apparatus of FIG. 3 with additional optional active temperature control elements, according to an embodiment. In some situations, the excess heat from excess heat-generating element 302 may not be enough, or may take too long to be generated, such as immediately after start up. Thus, it may be desirable to combine the above embodiments with active heating. FIG. 6 shows the addition of an optional TEC 602 which can be used for active heating or cooling. It may optionally have a separate heatsink 604, or could use path 304 to couple to heatsink 310. Alternately, a pure heating element 606 could be added, such as heating resistors.

In another embodiment, it may be desirable to transfer the heat from excess heat-generating element 302 to heat sink 310, and not have any of that heat reach temperature-sensitive element 306, which may already be at its maximum desired temperature, for example. However, some heat may flow along path 304 to temperature-sensitive element 306 even when thermal switch 308 is turned on. The design and component selection insures that the thermal resistance from 308 when the thermal switch is on is substantially lower than that from 316. However, to further increase the heat resistance, in one embodiment, heating path 304 is divided into a high heat transfer portion 610 (e.g., copper traces), and a slightly lower heat transfer path 612 (e.g., silicon carbide). For example, copper may have a thermal conductivity of 398 W/m*K (Watts per meter per degree Kelvin) and silicon carbide may have a thermal conductivity of 270 W/m*K. Alternately, heat transfer path 612 could simply be a narrower copper trace, or other geometry or materials to slightly increase the heat resistance.

Figures 7, 8:
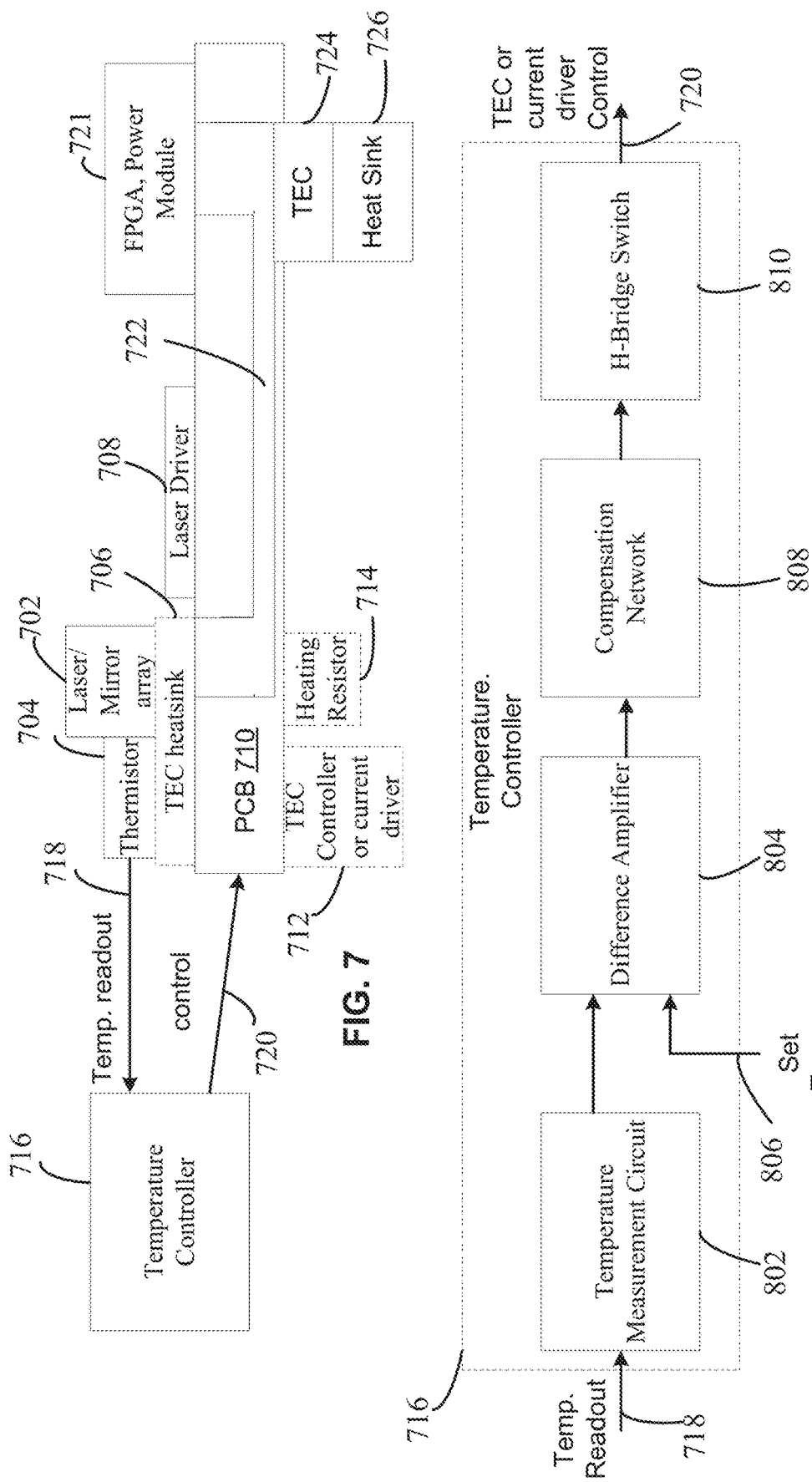
FIG. 7 is a diagram of a thermal recycling apparatus with a temperature controller, according to an embodiment.
FIG. 8 is a diagram of the temperature controller of FIG. 7 according to an embodiment.

FIG. 7 is a diagram of a thermal recycling apparatus with a temperature controller, according to an embodiment. A laser device (and/or mirror array) 702 (the temperature-sensitive device(s)) and a thermistor 704 are mounted on a printed circuit board (PCB) 710. A laser driver (and/or a mirror controller) 708 drives laser/mirror array 702. The thermistor 704 is placed close to the laser/mirror array 702 to sense the laser and/or mirror array temperature. The temperature information will be read out from the thermistor and sent to a temperature controller 716 on a temperature readout line 718. The temperature controller can be a dedicated microcontroller or can share the same central processing unit with an overall LiDAR module, or any other controller in the system.

An excess heat-generating element(s), such as FPGA/Power module 721, is located elsewhere on PCB 710. It is connected to a chip with laser/mirror array 702 via a heat transfer path 722 on PCB 710 (e.g., a copper trace). TEC 724 connects heat transfer path 722 to a heat sink 726. TEC 724 acts as a thermal switch. TEC 724 may consist of a TEC heatsink and separate TEC controller.

The temperature controller 716 compares the sensed temperature and a temperature set point (e.g., the minimum target temperature), and then generates the appropriate TEC control output on output line 720 to control the TEC 724. If the temperature of the thermistor is below the target temperature range, TEC 724 is turned off, so that heat flow to heat sink 726 is blocked. Instead, heat will flow through heat path 722 to laser/mirror array 702 as illustrated in FIG. 4. If the thermistor temperature is above the target temperature range, the controller can turn on TEC, opening its thermal path, and stopping or reducing the flow of heat along heat path 722 to laser/mirror array 702, as shown in FIG. 5.

Optional active temperature control can be added with a thermoelectric cooler (TEC) that consists of a TEC heatsink 706 and a TEC controller 712. The TEC heatsink 706 can optionally be mounted either inside or outside of the laser/mirror array 702 module package. The temperature controller 716 compares the sensed temperature and a temperature set point (e.g., the minimum target temperature), and then generates the appropriate TEC control output on output line 720 to control the TEC controller 712. If TEC 724 is turned off, but the heat flow on path 722 is not enough, or is too slow, to reach the target temperature, TEC controller 712 can be activated to actively heat laser/mirror module 702 with additional heat. If the temperature of the thermistor goes above the target temperature range, the controller can shut down heat path 722 with a control signal to TEC 724. If the temperature is still above the target temperature range, temperature controller 716 can change the target temperature from the minimum target temperature to a maximum target temperature, to cause cooling to initiate through TEC controller 712 and TEC heatsink 706. This negative feedback control loop will stabilize the laser temperature and its wavelength under a wide ambient temperature range.

In one embodiment, a heating resistor(s) 714 is added or used instead of TEC controller 712 and TEC heatsink 706 to provide additional active heating. As shown, TEC controller 712 and optional heat resistor 714 are mounted on the underside of PCB 308. A laser driver 712 is formed in the PCB 710. Alternately, the heating resistor could be mounted adjacent laser 702, or inside the package for laser 702.

The control line 720 can multiple control lines, with separate lines for TEC controller 712 and TEC 724. Alternately, control line 720 can be a bus with different addresses for TEC controller 712 and TEC 724.

FIG. 8 is a diagram of the temperature controller 716 of FIG. 7 according to an embodiment. Temperature readout line 718 from FIG. 3 is provided to the input of a temperature measurement circuit 802. An output of temperature measurement circuit 802 is provided to a first input of a difference amplifier 804. A second input to the difference amplifier is a set temperature 806, which corresponds to the target minimum temperature or the target maximum temperature. Difference amplifier 804 is then coupled to a compensation network 808, which in turn provides an output to an H—bridge switch 810. The output of the H—bridge switch is TEC control line 720.

In an embodiment using only heating resistors, and not an active heating TEC, the controller of FIG. 8 can be simplified. The temperature adjacent to the laser die is sensed with the temperature controller 716. If the temperature goes below the desired temperature range, a current driver 712 is activated to pump current into the heating resistor 714. The temperature is constantly monitored and fed back to the temperature controller 716. The temperature controller 716 will decide how much current needs to be pumped into the resistor in real-time to maintain the target temperature, using compensation network 808. The compensation network 808 can be either hardware or software or a combination. The software can include compensation algorithms such as a PD (Proportional-Derivative) or PID (Proportional-Integral-Derivative) controller. H-Bridge Switch 810 can be eliminated from temperature controller 716 in this embodiment. Also, the TEC controller 712 and TEC heatsink 706 would be eliminated in this heating resistor only embodiment. This embodiment can only heat, and not cool, to achieve the desired temperature range. Thus, the temperature range is chosen at the high end of the operating temperature range, so that cooling is not needed. In one embodiment, the target or designated temperature range corresponds to an ambient temperature range of +65/70-85 degrees Celsius.

In one embodiment, the operating environment temperature range generally is −40-85 degrees Celsius. Due to the laser's self-heating when operating, its junction temperature will generally be increased by around 10-20 degrees Celsius vs. the environmental temperature. Because of that, any sensing thermistor close to the laser will sense a temperature generally higher than the environmental temperature by a number of degrees. Thus, a laser diode indicated as working in an ambient temperature range up to +85 degrees Celsius is really working up to +95 to +105 degrees Celsius. With only a heating element, only the lower end of the operating range is controllable. But that still significantly reduces the range of wavelengths that will be emitted. In one embodiment, the controls are set so that the laser diode is heated to a minimum temperature of +35 or +40 degrees Celsius. In most environments, the ambient heat will not significantly increase the operating temperature, thus providing a narrow range of operating temperatures at the laser diode. Thus, the heating control clips any temperature from −30 to +35/40, only permitting higher temperatures. If the thermistor reads a target temperature value below the lower bound of the regulating range (e.g., 40 degrees Celsius), the heating (passive heat path 722 and/or active heating) is turned on and there is continuously monitoring of the temperature. Once the thermistor reading reaches the target temperature, the heating is turned off. The control loop will do this on/off operation in real-time to try to maintain the temperature to be at the target temperature—i.e. +40 degrees Celsius in one example. However, if the thermistor reading is already above the target temperature, the heating will not be turned on. Other values of the target temperature may be used. In another embodiment, the target temperature is a temperature in the range of +15 to +70 degrees Celsius.

Temperature Effect on Alignment

Stress develops in the interface between the chip (die) and the package because of a mismatch in CTE (coefficient of thermal expansion) of the two materials. For example, a die could be mainly made of silicon and an enclosure could be a ceramic package which is made of alumina. The CTEs of these two materials are different and they expand and contract at different rates with temperature. Alumina expands and contracts more than silicon, and thus stress develops at the interface of the two materials. This stress is transmitted to the devices in the substrate.

Thus, with changes of temperature, the laser may tilt due to the difference in thermal expansion. This tilting changes the alignment of the laser with the optics used in a LiDAR system, such as the micro mirrors used to scan the laser beam across an environment to be detected. Some consequences of misalignment include: (1) worse (larger) laser beam quality and thus larger energy loss, resulting in a shorter detection distance; (2) worse (larger) laser beam quality and thus worse resolution; and (3) the laser beam location can shift, resulting in in accuracy in the point cloud's position. By limiting the range of temperatures to a designated temperature range, the change of alignment is limited. The temperature range is chosen to provide a change in alignment of less than 15 micrometers.

Additionally, a minimum operating temperature for the laser is maintained by heating the laser as needed. The assembly conditions are set to be at or above this minimum temperature, to insure that the initial alignment is within the desired scope for the minimum set temperature. In one embodiment, the micro mirrors may be heated to the same target minimum temperature to maintain alignment. The micro mirror package can also be assembled at the same target minimum temperature.

Flowchart for Heat Recycling Method.

Figure 9:
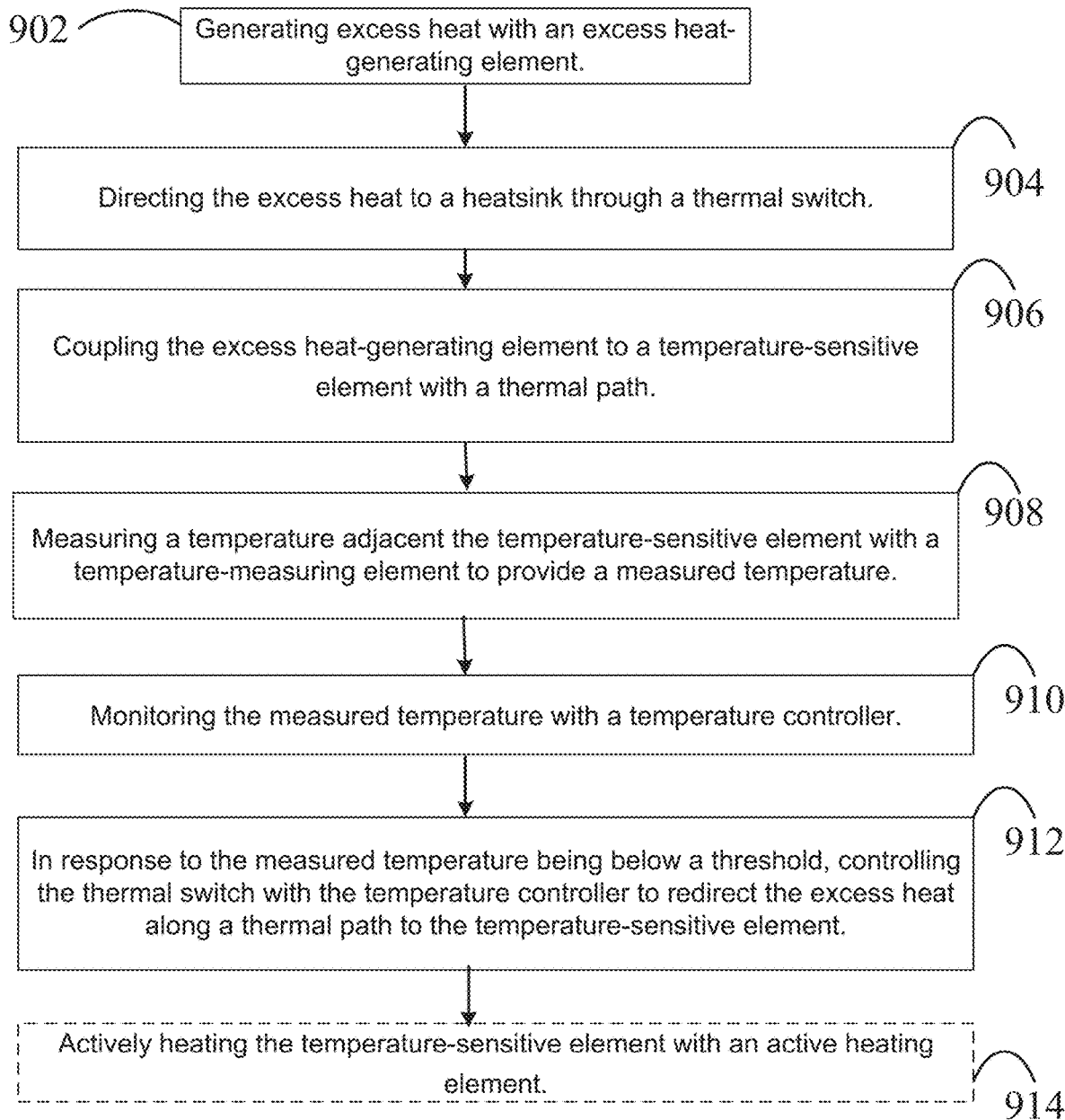
FIG. 9 is a flowchart of a method for controlling the path of excess heat according to embodiments of the present invention.

FIG. 9 is a flowchart of a method according to embodiments of the present invention. Step 902 is generating excess heat with an excess heat-generating element, Step 904 is directing the excess heat to a heatsink through a thermal switch. Step 906 is coupling the excess heat-generating element to a temperature-sensitive element with a thermal path. Next is measuring a temperature adjacent the temperature-sensitive element with a temperature-measuring element to provide a measured temperature (step 908). Step 910 is monitoring the measured temperature with a temperature controller. Finally, step 912 is, in response to the measured temperature being below a threshold, controlling the thermal switch with the temperature controller to redirect the excess heat along a thermal path to the temperature-sensitive element.

In one embodiment, further optional steps include step 914, actively heating the temperature-sensitive element with an active heating element. This may be done with a TEC, or heating resistors, as described above.

In summary, in one embodiment, an apparatus for controlling the wavelength of a laser beam during temperature changes is provided. The apparatus comprises the following elements:
  an excess heat-generating element 302;
  a heat sink 310;
  a heat conduction path 304 coupling the excess heat-generating element to the heat sink;
  a thermal switch 308 mounted in the heat conduction path;
  a temperature-sensitive element 306 coupled to the heat conduction path on a same side of the thermal switch as the excess heat-generating element;
  a temperature measurement device 704 mounted adjacent the temperature-sensitive element and having a temperature output; and
  a temperature controller 716 having an input coupled to the temperature output 718 of the temperature measurement device and having an output control line 720 coupled to an input of the thermal switch, the temperature controller being configured to switch off the thermal switch, in response to detecting a temperature below a temperature threshold from the temperature output of the temperature measurement device, to impede heat flow from the excess heat-generating element to the heat sink, and increase heat flow from the excess heat-generating element to the temperature-sensitive element.

In another embodiment, an apparatus for beam steering in a Light Detection and Ranging (LiDAR) system of an autonomous vehicle is provided. The apparatus comprises the following elements:
  a printed circuit board 710;
  at least one of a laser and a mirror assembly 702 mounted on the printed circuit board;
  a thermistor 704 mounted adjacent the one of a laser and a mirror assembly and having a temperature output;
  a LiDAR chip 720, mounted on the printed circuit board, which produces excess heat;
  a heat sink 726;
  a heat conduction path 722 coupled to the LiDAR chip and to the one of a laser and a mirror assembly;
  a thermal switch 724 coupled between the heat conduction path and the heat sink; and
  a temperature controller 716 having an input coupled to the temperature output 718 of the thermistor and having an output control line 720 coupled to an input of the thermal switch, the temperature controller being configured to switch off the thermal switch, in response to detecting a temperature below a temperature threshold from the temperature output of the thermistor, to impede heat flow from the LiDAR chip to the heat sink, and increase heat flow from the LiDAR chip to the one of a laser and a mirror assembly.

Example LiDAR System Implementing Aspects of Embodiments Herein

Figure 10:
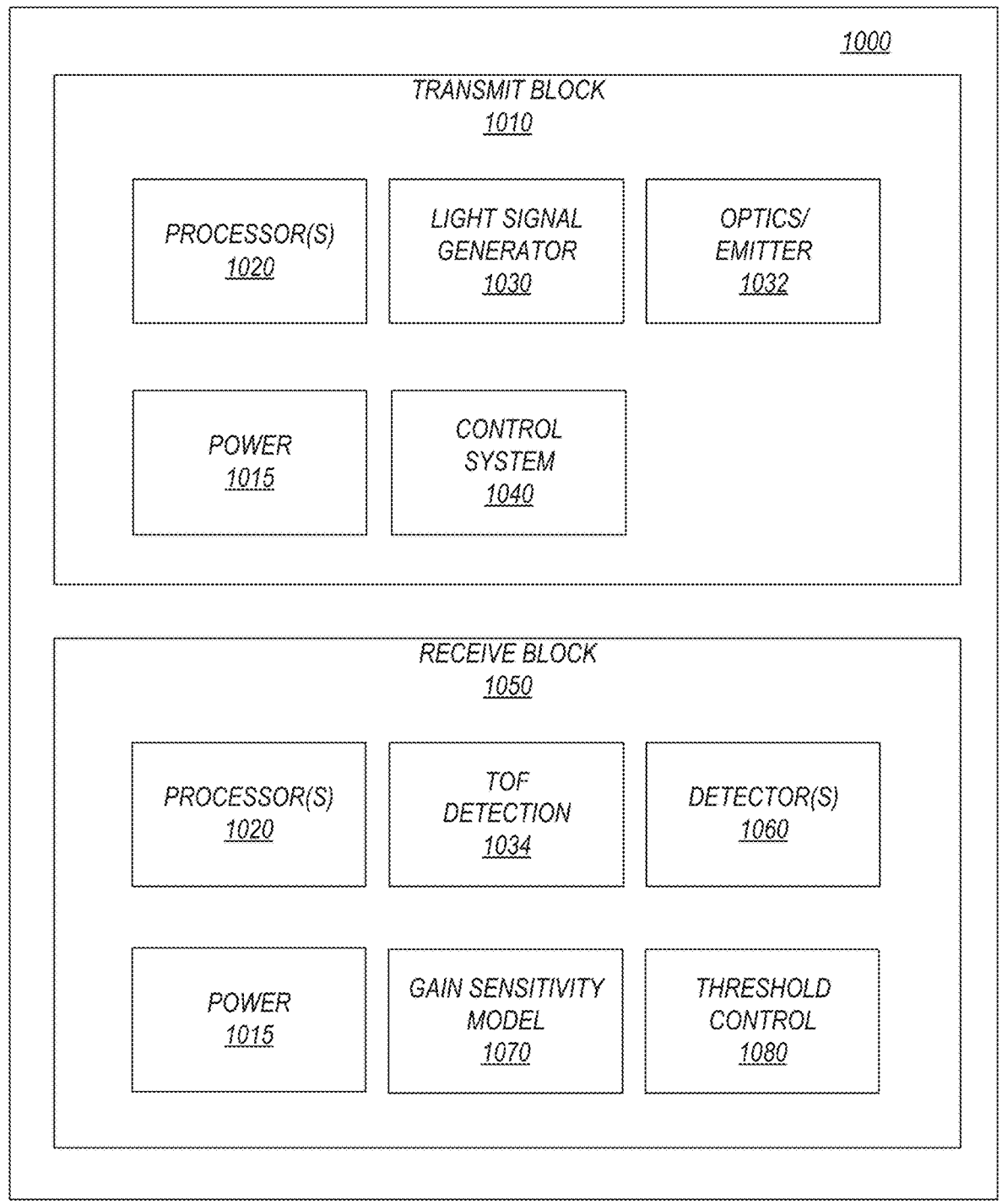
FIG. 10 illustrates a simplified block diagram showing aspects of a LiDAR-based detection system, according to certain embodiments of the invention.

FIG. 10 illustrates a simplified block diagram showing aspects of a LiDAR-based detection system 1000, according to certain embodiments, in which the embodiments described above can be imbedded and controlled. System 1000 may be configured to transmit, detect, and process LiDAR signals to perform object detection as described above with regard to LiDAR system 1000 described in FIG. 1. In general, a LiDAR system 1000 includes one or more transmitters (e.g., transmit block 1010) and one or more receivers (e.g., receive block 1050). LiDAR system 1000 may further include additional systems that are not shown or described to prevent obfuscation of the novel features described herein.

Transmit block 1010, as described above, can incorporate a number of systems that facilitate that generation and emission of a light signal, including dispersion patterns (e.g., 360 degree planar detection), pulse shaping and frequency control, Time-Of-Flight (TOF) measurements, and any other control systems to enable the LiDAR system to emit pulses in the manner described above. In the simplified representation of FIG. 10, transmit block 1010 can include processor(s) 1020, light signal generator 1030, optics/emitter module 1032, power block 1015 and control system 1040. Some or all of system blocks 1030-1040 can be in electrical communication with processor(s) 1020.

In certain embodiments, processor(s) 1020 may include one or more microprocessors (μCs) and can be configured to control the operation of system 1000. Alternatively or additionally, processor 1020 may include one or more microcontrollers (MCUs), digital signal processors (DSPs), or the like, with supporting hardware, firmware (e.g., memory, programmable I/Os, etc.), and/or software, as would be appreciated by one of ordinary skill in the art. Alternatively, MCUs, μCs, DSPs, ASIC, programmable logic device, and the like, may be configured in other system blocks of system 1000. For example, control system block 1040 may include a local processor to certain control parameters (e.g., operation of the emitter). In particular, a TEC can be controlled to provide the desired temperature, and achieve the desired wavelength range and minimum temperature wavelength. Processor(s) 1020 may control some or all aspects of transmit block 1010 (e.g., optics/emitter 1032, control system 1040, dual sided mirror 220 position as shown in FIG. 1, position sensitive device 250, etc.), receive block 1050 (e.g., processor(s) 1020) or any aspects of LiDAR system 1000. In some embodiments, multiple processors may enable increased performance characteristics in system 1000 (e.g., speed and bandwidth), however multiple processors are not required, nor necessarily germane to the novelty of the embodiments described herein. Alternatively or additionally, certain aspects of processing can be performed by analog electronic design, as would be understood by one of ordinary skill in the art.

Light signal generator 1030 may include circuitry (e.g., a laser diode) configured to generate a light signal, which can be used as the LiDAR send signal, according to certain embodiments. In some cases, light signal generator 1030 may generate a laser that is used to generate a continuous or pulsed laser beam at any suitable electromagnetic wavelengths spanning the visible light spectrum and non-visible light spectrum (e.g., ultraviolet and infra-red). In some embodiments, lasers are commonly in the range of 600-1200 nm, although other wavelengths are possible, as would be appreciated by one of ordinary skill in the art.

Optics/Emitter block 1032 (also referred to as transmitter 1032) may include one or more arrays of mirrors for redirecting and/or aiming the emitted laser pulse, mechanical structures to control spinning and/or moving of the emitter system, or other system to affect the system field-of-view, as would be appreciated by one of ordinary skill in the art with the benefit of this disclosure. For instance, some systems may incorporate a beam expander (e.g., convex lens system) in the emitter block that can help reduce beam divergence and increase the beam diameter. These improved performance characteristics may mitigate background return scatter that may add noise to the return signal. In some cases, optics/emitter block 1032 may include a beam splitter to divert and sample a portion of the pulsed signal. For instance, the sampled signal may be used to initiate the TOF clock. In some cases, the sample can be used as a reference to compare with backscatter signals. Some embodiments may employ micro electromechanical mirrors (MEMS) that can reorient light to a target field. Alternatively or additionally, multi-phased arrays of lasers may be used. Any suitable system may be used to emit the LiDAR send pulses, as would be appreciated by one of ordinary skill in the art.

Power block 1015 can be configured to generate power for transmit block 1010, receive block 1050, as well as manage power distribution, charging, power efficiency, and the like. In some embodiments, power management block 1015 can include a battery (not shown), and a power grid within system 1000 to provide power to each subsystem (e.g., control system 1040, etc.). The functions provided by power management block 1015 may be subsumed by other elements within transmit block 1010, or may provide power to any system in LiDAR system 1000. Alternatively, some embodiments may not include a dedicated power block and power may be supplied by a number of individual sources that may be independent of one another.

Control system 1040 may control aspects of light signal generation (e.g., pulse shaping), optics/emitter control, TOF timing, or any other function described herein. In some cases, aspects of control system 1040 may be subsumed by processor(s) 1020, light signal generator 1030, or any block within transmit block 1010, or LiDAR system 1000 in general.

Receive block 1050 may include circuitry configured to detect and process a return light pulse to determine a distance of an object, and in some cases determine the dimensions of the object, the velocity and/or acceleration of the object, and the like. Processor(s) 1065 may be configured to perform operations such as processing received return pulses from detectors(s) 1060, controlling the operation of TOF module 1034, controlling threshold control module 1080, or any other aspect of the functions of receive block 1050 or LiDAR system 1000 in general.

TOF module 1034 may include a counter for measuring the time-of-flight of a round trip for a send and return signal. In some cases, TOF module 1034 may be subsumed by other modules in LiDAR system 1000, such as control system 1040, optics/emitter 1032, or other entity. TOF modules 1034 may implement return "windows" that limit a time that LiDAR system 1000 looks for a particular pulse to be returned. For example, a return window may be limited to a maximum amount of time it would take a pulse to return from a maximum range location (e.g., 250 m). Some embodiments may incorporate a buffer time (e.g., maximum time plus 10%). TOF module 1034 may operate independently or may be controlled by other system block, such as processor(s) 1020, as described above. In some embodiments, the transmit block may also include a TOF detection module. One of ordinary skill in the art with the benefit of this disclosure would appreciate the many modifications, variations, and alternative ways of implementing the TOF detection block in system 1000.

Detector(s) 1060 may detect incoming return signals that have reflected off of one or more objects. In some cases, LiDAR system 1000 may employ spectral filtering based on wavelength, polarization, and/or range to help reduce interference, filter unwanted frequencies, or other deleterious signals that may be detected. In particular, a narrow passband filter can be used, either static or dynamic. A passband as narrow as 20 or even 15 nm may be used. Typically, detector(s) 1060 can detect an intensity of light and records data about the return signal (e.g., via coherent detection, photon counting, analog signal detection, or the like). Detector (s) 1060 can use any suitable photodetector technology including solid state photodetectors (e.g., silicon avalanche photodiodes, complimentary metal-oxide semiconductors (CMOS), charge-coupled devices (CCD), hybrid CMOS/CCD devices) or photomultipliers. In some cases, a single receiver may be used or multiple receivers may be configured to operate in parallel.

Gain sensitivity model 1070 may include systems and/or algorithms for determining a gain sensitivity profile that can be adapted to a particular object detection threshold. The gain sensitivity profile can be modified based on a distance (range value) of a detected object (e.g., based on TOF measurements). In some cases, the gain profile may cause an object detection threshold to change at a rate that is inversely proportional with respect to a magnitude of the object range value. A gain sensitivity profile may be generated by hardware/software/firmware, or gain sensor model 1070 may employ one or more look up tables (e.g., stored in a local or remote database) that can associate a gain value with a particular detected distance or associate an appropriate mathematical relationship there between (e.g., apply a particular gain at a detected object distance that is 10% of a maximum range of the LiDAR system, apply a different gain at 15% of the maximum range, etc.). In some cases, a Lambertian model may be used to apply a gain sensitivity profile to an object detection threshold. The Lambertian model typically represents perfectly diffuse (matte) surfaces by a constant bidirectional reflectance distribution function (BRDF), which provides reliable results in the LiDAR system as described herein. However, any suitable gain sensitivity profile can be used including, but not limited to, Oren-Nayar model, Nanrahan-Krueger model, Cook-Torrence model, Diffuse BRDF model, Limmel-Seeliger model, Blinn-Phong model, Ward model, HTSG model, Fitted Lafortune model, or the like. One of ordinary skill in the art with the benefit of this disclosure would understand the many alternatives, modifications, and applications thereof.

Threshold control block 1080 may set an object detection threshold for LiDAR system 1000. For example, threshold control block 1080 may set an object detection threshold over a certain full range of detection for LiDAR system 1000. The object detection threshold may be determined based on a number of factors including, but not limited to, noise data (e.g., detected by one or more microphones) corresponding to an ambient noise level, and false positive data (typically a constant value) corresponding to a rate of false positive object detection occurrences for the LiDAR system. In some embodiments, the object detection threshold may be applied to the maximum range (furthest detectable distance) with the object detection threshold for distances ranging from the minimum detection range up to the maximum range being modified by a gain sensitivity model (e.g., Lambertian model).

Although certain systems may not be expressly discussed, they should be considered as part of system 1000, as would be understood by one of ordinary skill in the art. For example, system 1000 may include a bus system (e.g., CAMBUS) to transfer power and/or data to and from the different systems therein. In some embodiments, system 1000 may include a storage subsystem (not shown). A storage subsystem can store one or more software programs to be executed by processors (e.g., in processor(s) 1020). It should be understood that "software" can refer to sequences of instructions that, when executed by processing unit(s) (e.g., processors, processing devices, etc.), cause system 1000 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in part to volatile working memory during program execution. From a storage subsystem, processing devices can retrieve program instructions to execute in order to execute various operations (e.g., software-controlled spring auto-adjustment, etc.) as described herein. Some software controlled aspects of LiDAR system 1000 may include aspects of gain sensitivity model 1070, threshold control 1080, control system 1040, TOF module 1034, or any other aspect of LiDAR system 1000.

It should be appreciated that system 1000 is meant to be illustrative and that many variations and modifications are possible, as would be appreciated by one of ordinary skill in the art. System 1000 can include other functions or capabilities that are not specifically described here. For example, LiDAR system 1000 may include a communications block (not shown) configured to enable communication between LiDAR system 1000 and other systems of the vehicle or remote resource (e.g., remote servers), etc., according to certain embodiments. In such cases, the communications block can be configured to provide wireless connectivity in any suitable communication protocol (e.g., radio-frequency (RF), Bluetooth, BLE, infra-red (IR), ZigBee, Z-Wave, Wi-Fi, or a combination thereof).

While system 1000 is described with reference to particular blocks (e.g., threshold control block 1080), it is to be understood that these blocks are defined for understanding certain embodiments of the invention and it is not implied or intended that embodiments are limited to a particular physical arrangement of component parts. The individual blocks need not correspond to physically distinct components. Blocks can be configured to perform various operations, e.g., by programming a processor or providing appropriate processes, and various blocks may or may not be reconfigurable depending on how the initial configuration is obtained. Certain embodiments can be realized in a variety of apparatuses including electronic devices implemented using any combination of circuitry and software. Furthermore, aspects and/or portions of system 1000 may be combined with or operated by other sub-systems as informed by design. For example, power management block 1015 and/or threshold control block 1080 may be integrated with processor(s) 1020 instead of functioning as separate entities.

Example Computer Systems Implementing Aspects of Embodiments Herein

Figure 11:
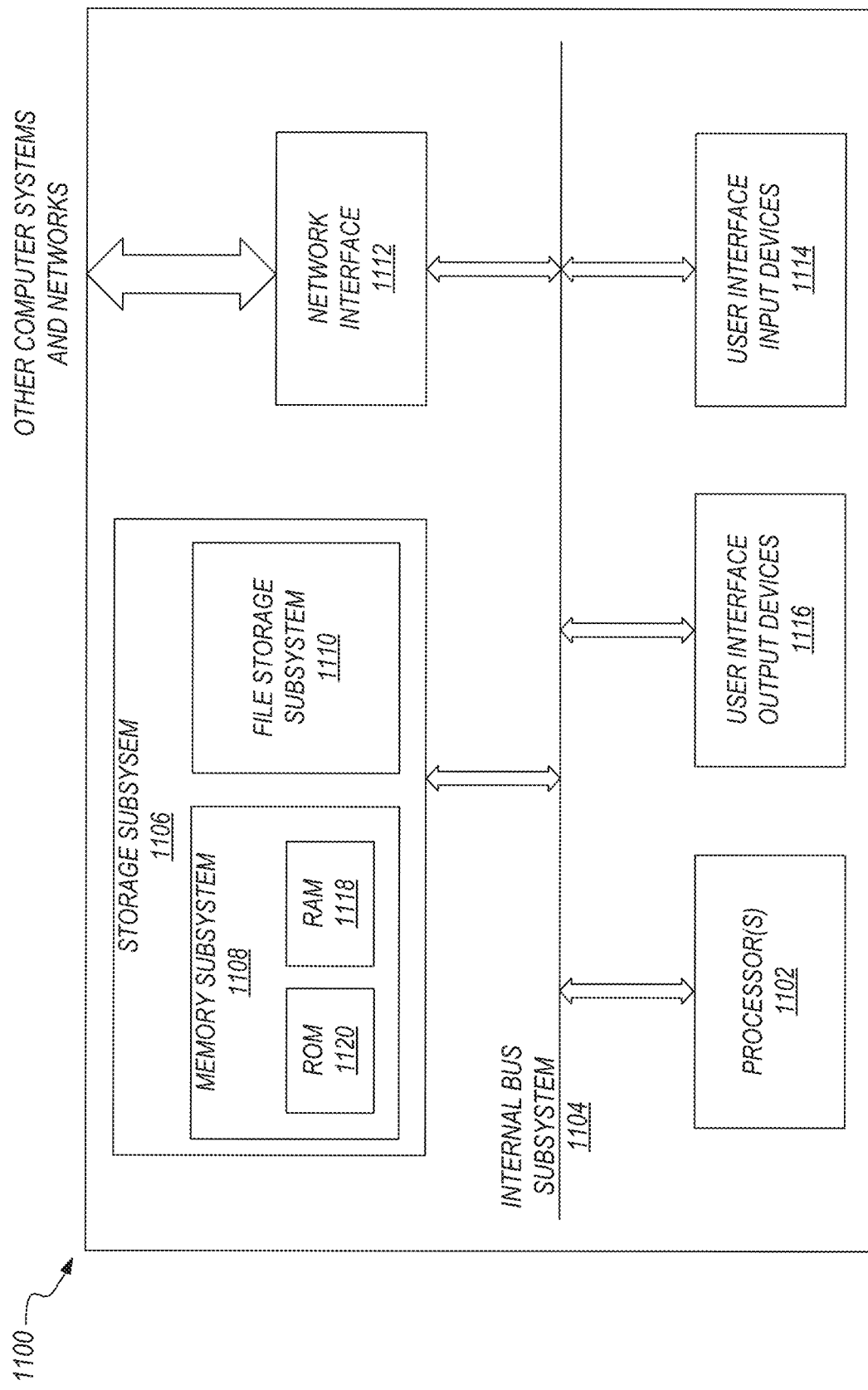
FIG. 11 illustrates an example computer system that may be utilized to implement techniques disclosed herein, according to certain embodiments of the invention.

FIG. 11 is a simplified block diagram of a computing system 1100 configured to operate aspects of a LiDAR-based detection system, according to certain embodiments. Computing system 1100 can be used to implement any of the systems and modules discussed above with respect to FIGS. 1-10. For example, computing system 1100 may operate aspects of threshold control 1080, TOF module 1034, processor(s) 1020, control system 1040, or any other element of LiDAR system 1000 or other system described herein. Computing system 1100 can include, for example, a field programmable gate array (FPGA), an application specific integrated circuit (ASIC), and a general purpose central processing unit (CPU), to implement the disclosed techniques, including the techniques described from FIG. 1-FIG. 9, such as controller 716. In some examples, computing system 1100 can also one or more processors 1102 that can communicate with a number of peripheral devices (e.g., input devices) via a bus subsystem 1104. Processors 1102 can be an FPGA, an ASIC, a CPU, etc. These peripheral devices can include storage subsystem 1106 (comprising memory subsystem 1108 and file storage subsystem 1110), user interface input devices 1114, user interface output devices 1116, and a network interface subsystem 1112.

In some examples, internal bus subsystem 1104 (e.g., CAMBUS) can provide a mechanism for letting the various components and subsystems of computer system 1100 communicate with each other as intended. Although internal bus subsystem 1104 is shown schematically as a single bus, alternative embodiments of the bus subsystem can utilize multiple buses. Additionally, network interface subsystem 1112 can serve as an interface for communicating data between computing system 1100 and other computer systems or networks. Embodiments of network interface subsystem 1112 can include wired interfaces (e.g., Ethernet, CAN, RS232, RS485, etc.) or wireless interfaces (e.g., ZigBee, Wi-Fi, cellular, etc.).

In some cases, user interface input devices 1114 can include a keyboard, pointing devices (e.g., mouse, trackball, touchpad, etc.), a barcode scanner, a touch-screen incorporated into a display, audio input devices (e.g., voice recognition systems, microphones, etc.), Human Machine Interfaces (HMI) and other types of input devices. In general, use of the term "input device" is intended to include all possible types of devices and mechanisms for inputting information into computing system 1100. Additionally, user interface output devices 1116 can include a display subsystem, a printer, or non-visual displays such as audio output devices, etc. The display subsystem can be any known type of display device. In general, use of the term "output device" is intended to include all possible types of devices and mechanisms for outputting information from computing system 1100.

Storage subsystem 1106 can include memory subsystem 1108 and file/disk storage subsystem 1110. Subsystems 1108 and 1110 represent non-transitory computer-readable storage media that can store program code and/or data that provide the functionality of embodiments of the present disclosure. In some embodiments, memory subsystem 1108 can include a number of memories including main random access memory (RAM) 1118 for storage of instructions and data during program execution and read-only memory (ROM) 1120 in which fixed instructions may be stored. File storage subsystem 1110 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 1100 is illustrative and not intended to limit embodiments of the present disclosure. Many other configurations having more or fewer components than system 1100 are possible.

The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local-area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C# or C++, or any scripting language, such as Perl, Python or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as RAM or ROM, as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Non-transitory storage media and computer-readable storage media for containing code, or portions of code, can include any appropriate media known or used in the art such as, but not limited to, volatile and non-volatile, removable and non-removable media implemented in any method or technology for storage of information such as computer-readable instructions, data structures, program modules or other data, including RAM, ROM, Electrically Erasable Programmable Read-Only Memory (EEPROM), flash memory or other memory technology, CD-ROM, DVD or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments. However, computer-readable storage media does not include transitory media such as carrier waves or the like.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the examples, alternative examples, etc., and the concepts thereof may be applied to any other examples described and/or within the spirit and scope of the disclosure.

For example, instead of using a single laser to illuminate the array of MEMS mirrors, an array of mirrors may be used. Also, the pattern generation and decoding could be hardwired, in firmware or in software in different embodiments.

The structure of the present invention can be used in a variety of other applications than LIDAR. Light beam steering techniques can also be used in other optical systems, such as optical display systems (e.g., TVs), optical sensing systems, optical imaging systems, and the like. In various light beam steering systems, the light beam may be steered by, for example, a rotating platform driven by a motor, a multi-dimensional mechanical stage, a Galvo-controlled mirror, a resonant fiber, an array of microelectromechanical (MEMS) mirrors, or any combination thereof. A MEMS micro-mirror may be rotated around a pivot or connection point by, for example, a micro-motor, an electromagnetic actuator, an electrostatic actuator, or a piezoelectric actuator.

The MEMS mirror structure of the present invention can have the mirror mass driven by different types of actuators. In some light steering systems, the transmitted or received light beam may be steered by an array of micro-mirrors. Each micro-mirror may rotate around a pivot or connection point to deflect light incident on the micro-mirror to desired directions. The performance of the micro-mirrors may directly affect the performance of the light steering system, such as the field of view (FOV), the quality of the point cloud, and the quality of the image generated using a light steering system. For example, to increase the detection range and the FOV of a LiDAR system, micro-mirrors with large rotation angles and large apertures may be used, which may cause an increase in the maximum displacement and the moment of inertia of the micro-mirrors. To achieve a high resolution, a device with a high resonant frequency may be used, which may be achieved using a rotating structure with a high stiffness. It may be difficult to achieve this desired performance using electrostatic actuated micro-mirrors because comb fingers used in an electrostatic-actuated micro-mirror may not be able to provide the force and moment needed and may disengage at large rotation angles, in particular, when the aperture of the micro-mirror is increased to improve the detection range. Some piezoelectric actuators may be used to achieve large displacements and large scanning angles due to their ability to provide a substantially larger drive force than electrostatic-actuated types, with a relatively lower voltage.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

What is claimed is:

1. An apparatus for beam steering in a Light Detection and Ranging (LiDAR) system of an autonomous vehicle, the apparatus comprising:
   a printed circuit board;
   at least one of a laser and a mirror assembly mounted on the printed circuit board;
   a thermistor mounted adjacent the one of a laser and a mirror assembly and having a temperature output;
   a LiDAR chip, mounted on the printed circuit board, which produces excess heat;
   a heat sink;
   a heat conduction path coupled to the LiDAR chip and to the one of a laser and a mirror assembly;
   a thermal switch coupled between the heat conduction path and the heat sink; and
   a temperature controller having an input coupled to the temperature output of the thermistor and having an output control line coupled to an input of the thermal switch, the temperature controller being configured to switch off the thermal switch, in response to detecting a temperature below a temperature threshold from the temperature output of the thermistor, to impede heat flow from the LiDAR chip to the heat sink, and increase heat flow from the LiDAR chip to the one of a laser and a mirror assembly.

2. The apparatus of claim 1 wherein the thermal switch comprises a Thermoelectric Cooler (TEC).

3. The apparatus of claim 1 wherein the LiDAR chip comprises one of a power module or a controller.

4. The apparatus of claim 1 wherein the heat conduction path comprises at least one metal trace.

5. The apparatus of claim 1 wherein the thermal switch has one or more positions between on and off.

6. The apparatus of claim 1 further comprising an active heat generator coupled to the one of a laser and a mirror assembly.

7. The apparatus of claim 1 wherein the thermal switch is a single stage TEC.

8. An apparatus comprising:
   an excess heat-generating element;
   a heat sink;
   a heat conduction path coupling the excess heat-generating element to the heat sink;
   a thermal switch mounted in the heat conduction path;
   a temperature-sensitive element coupled to the heat conduction path on a same side of the thermal switch as the excess heat-generating element;
   a temperature measurement device mounted adjacent the temperature-sensitive element and having a temperature output; and
   a temperature controller having an input coupled to the temperature output of the temperature measurement device and having an output control line coupled to an input of the thermal switch, the temperature controller being configured to switch off the thermal switch, in response to detecting a temperature below a temperature threshold from the temperature output of the temperature measurement device, to impede heat flow from the excess heat-generating element to the heat sink, and increase heat flow from the excess heat-generating element to the temperature-sensitive element.

9. The apparatus of claim 8 wherein the temperature-sensitive element comprises one of a laser and a mirror assembly.

10. The apparatus of claim 9 wherein the temperature controller comprises:
    a temperature measurement circuit having an input coupled to the temperature output of the temperature measurement device;
    a difference amplifier having a first input coupled to an output of the temperature measurement circuit and a second input coupled to a set temperature corresponding to a minimum target temperature;
    a compensation network coupled to an output of the difference amplifier; and
    an H-bridge switch coupled to an output of the compensation network and having a control output coupled to an input of the thermal switch.

11. The apparatus of claim 8 wherein the thermal switch comprises a Thermoelectric Cooler (TEC).

12. The apparatus of claim 8 wherein the temperature-sensitive element comprises an optical assembly including a micro mirror, mounted to scan a laser beam from a laser across an environment to be detected; and further comprising:
    a filter mounted to intercept a reflected beam directed to the micro mirror, the filter having a passband corresponding to a designated wavelength range.

13. The apparatus of claim 8 wherein the excess heat-generating element comprises one of a power module or a controller.

14. The apparatus of claim 8 wherein the heat conduction path comprises at least one metal trace.

15. The apparatus of claim 8 wherein the thermal switch has one or more positions between on and off.

16. The apparatus of claim 8 further comprising an active heat generator coupled to the temperature-sensitive element.

17. A method comprising:
    generating excess heat with an excess heat-generating element;
    directing the excess heat to a heatsink through a thermal switch;
    coupling the excess heat-generating element to a temperature-sensitive element with a thermal path;
    measuring a temperature adjacent the temperature-sensitive element with a temperature-measuring element to provide a measured temperature;
    monitoring the measured temperature with a temperature controller;
    in response to the measured temperature being below a threshold, controlling the thermal switch with the temperature controller to redirect the excess heat along a thermal path to the temperature-sensitive element.

18. The method of claim 17 further comprising actively heating the temperature-sensitive element with an active heating element.

19. The method of claim 17 further comprising:
    scanning a laser beam across an environment to be detected with a micro mirror assembly;
    filtering a reflected beam with a filter having a passband corresponding to a designated wavelength range; and
    detecting the reflected beam with a photodetector.

20. The method of claim 19 further comprising cooling the temperature-sensitive element when the measured temperature reaches an upper threshold.

* * * * *